United States Patent [19]

Savoye

[11] Patent Number: 4,656,519
[45] Date of Patent: Apr. 7, 1987

[54] BACK-ILLUMINATED CCD IMAGERS OF INTERLINE TRANSFER TYPE

[75] Inventor: Eugene D. Savoye, Lancaster County, Pa.

[73] Assignee: RCA Corporation, Princeton, N.J.

[21] Appl. No.: 784,662

[22] Filed: Oct. 4, 1985

[51] Int. Cl.[4] .......................... H04N 3/14; H01L 27/14
[52] U.S. Cl. ......................................... 358/213; 357/24
[58] Field of Search .............................. 358/213, 212; 357/24 LR

[56] References Cited

U.S. PATENT DOCUMENTS

| | | | |
|---|---|---|---|
| 3,806,729 | 4/1974 | Caywood | 250/339 |
| 3,814,955 | 6/1974 | Itoh et al. | 307/304 |
| 4,010,319 | 3/1977 | Levine | 358/213 |
| 4,040,092 | 8/1977 | Carnes | 358/213 |
| 4,064,533 | 12/1977 | Lampe et al. | 358/213 |
| 4,085,456 | 4/1978 | Tompsett | 358/213 |
| 4,104,543 | 8/1978 | Maeding | 307/221 D |
| 4,293,877 | 10/1981 | Tsunekawa et al. | 358/213 |
| 4,301,520 | 11/1981 | Green | 365/189 |
| 4,369,458 | 1/1983 | Thomas et al. | 357/24 LR |

OTHER PUBLICATIONS

M. Kimata et al., "A 480×400 Element Image Sensor with a Charge Sweep Device", 1985, IEEE ISSCC Digest of Technical Papers, pp. 100–101.

Primary Examiner—Gene Z. Rubinson
Assistant Examiner—Stephen Brinich
Attorney, Agent, or Firm—Eugene M. Whitacre; Allen LeRoy Limberg; James B. Hayes

[57] ABSTRACT

Back-illuminated CCD imagers of interline transfer type are made possible by deep, highly doped implant regions which bury the CCDs with respect to the back-illuminated surfaces of the imager substrates. Transfer smear caused by photoconversion in the CCD charge transfer channels must be suppressed in certain of these back-illuminated CCD imagers of interline transfer type, and suitable suppression methods are described.

28 Claims, 9 Drawing Figures

BACK-ILLUMINATED CCD IMAGERS OF INTERLINE TRANSFER TYPE

The present invention relates to charge-coupled-device (CCD) imagers of interline transfer type and, more particularly, to structures allowing illumination from the surface of the semiconductor substrate opposite to the surface on which the gate electrodes are disposed—i.e., for "back illumination".

BACKGROUND OF THE INVENTION

Interline transfer CCD imagers have, separate from the CCD portions of the imager, lines of photosensors in which elements (or pixels) of a radiant energy image are photoconverted to charge packets. These CCD imagers use a parallel array of CCD line registers (i.e., a field register) shielded from or not photosensitive to image irradiation, for transporting lines of charge packets representative of image element samples. These charge packets are transferred into the CCD line registers from the photosensors at selected times. These charge packets are transported to load in parallel the successive charge transfer stages of a CCD output line register, also shielded from or not photosensitive to image irradiation. The output line register is serially unloaded to supply charge packets in raster-scan order to a charge sensing stage for conversion to video signal voltage samples.

The charge packets descriptive of image elements are generated by parallel lines of photosensors adjacent to or stacked on top of the CCD registers, and these charge packets are transferred into charge transfer stages in the CCD register during retract intervals, each stage being respectively connected to a particular photosensor. The photosensors in some interline transfer imagers are provided by photocharge collection regions induced under gate electrodes and in portions of the substrate of semiconductive material, other than those portions taken up by CCD registers. The photosensors in other interline transfer imagers are provided by photodiodes which may be disposed in or over the substrate to provide photocharge collecting regions. Visible light imagers constructed on a silicon substrate normally have photosensors comprising photocharge collecting regions disposed in the substrate. The photocharge collecting regions may be made by selectively doping the bulk semiconductive material to form photodiodes, or they may be induced in the bulk semiconductive material by applying appropriate voltages to overlying gate electrode structures. Infrared imagers constructed on a silicon substrate use photosensors disposed over the substrate; the photosensors may be platinum silicide/platinum Schottky barrier diodes, for example.

The parallelly arrayed CCD registers may be "column" registers disposed perpendicularly with respect to the lines of photosensors, with transfer of fields of charge packets being made during field retrace intervals. Or, in the case of charge sweep devices (CSD) imagers, the charge packets may be transferred into the column registers a line at a time during each line retrace interval in the field trace interval and transferred through the column registers during the following line trace intervals, to be integrated and transferred into the output line register during line retrace intervals. Alternatively, the parallelly arrayed CCD registers may be "row" registers disposed parallelly with respect to the lines of photosensors, with transfers of lines of charge packets being made during line retrace intervals.

Where there is need for shielding CCD shift registers from irradiation by the image, it has been prior art practice to project the radiant energy into photosensors located on the same side of the substrate that the gate electrodes of the CCD registers are disposed on. That is, "front illumination" has been employed, so the irradiation shields can be emplaced in accurate registration with the CCD registers themselves, using additional photolithographic steps.

"Fill factor" in CCD imagery is a term used to describe what portion of the radiant energy in an image is made available to the photosensors, and a fill factor approaching 100% is desirable from the standpoint of imager sensitivity. The fill factors associated with the front-illuminated interline transfer imagers are low compared to those of other types of imager, such as the field transfer CCD imager, which are constructed on thinned semiconductor substrates and are "back-illuminated". (The terms "front-illumination" and "back-illumination" are used by television camera designers, particularly designers of visible-light-sensitive television cameras. The "front" and "back" correspond to the "top" surface and "bottom" surface in the convention that solid-state device makers customarily use to describe the imager die). The interline transfer imagers tend to have relatively low fill factors because there is no photoconversion of the portions of the image falling on the radiation shields over the CCD registers. Some attempts have been made in the prior art to improve fill factor for interline transfer imagers using lenticular lens structures to concentrate image energy on the lines of photosensors, diverting image energy away from the radiation shields over the CCD register, where it would be reflected or absorbed and thermally dissipated.

Insofar as improving fill factor is concerned, back-illumination of a CCD imager of interline transfer type is not advantageous as long as radiation shields are used with the CCD registers. The thinned semiconductor substrate used for a back-illuminated imager is notorious for its tendency to buckle along its expanse when held down to a planar surface (e.g., by a vacuum holddown), so it is difficult to obtain registration between the photolithographic processes used to define the irradiation shields and the CCD registers when they are disposed on opposite surfaces of the substrate. The irradiation shields on the opposite surface of the substrate from the CCD registers are further away from these CCD registers than if they were on the same surface of the substrate. So, undesirably, there is a greater tendency for irradiation to enter each CCD register at an angle under the edge of its irradiation shield. To cope with these problems, the irradiation shields have to be wider on a back-illuminated surface than on a front-illuminated one, which tends to reduce fill factor.

Even with irradiation shields disposed over the CCD registers of an interline transfer imager, irrespective of whether front- or back-illumination is employed, there is a tendency for them to accumulate some photocharge. This attributable to diffusion of charge carriers through the substrate from portions of the substrate bulk, where photoconversion takes place, under the channel stops defining the charge transfer channels of the CCD registers and up into the potential wells induced in the CCD registers at or near the imager top surface. This tendency has been forestalled in front-illuminated interline transfer imagers manufactured by Sharp and by Toshiba by placing buried implantations of a deep dopant (e.g., ion-implanted boron in a p−type silicon substrate), so that carriers from the bulk underlying the charge integrity sites cannot diffuse into the CCD registers through their bottoms. These buried implantations are similar to the buried implantations commonly used under anti-blooming drains and are placed by the same manufacturing steps.

SUMMARY OF THE INVENTION

Such buried implantations can be placed under the CCD registers, the present inventor discerns, to bury the CCD register respective to the surface of the imager opposite to the surface on which the gate electrodes are disposed. The CCD register is buried with respect to the surface opposite the surface from which the CCD register is conventionally buried. This makes possible an interline transfer imager, that is constructed on a semiconductive substrate in which photoconversion of the radiant energy image takes place, and that is back-illuminated to obtain a higher fill factor than found in front-illuminated interline transfer imagers.

No irradiation shields are placed over the CCD registers which are in the same area of the imager die as the photocharge collecting regions, so photoconversion takes place in the bulk semiconductive material under the CCD registers, as well as in the photocharge collecting regions and the bulk semiconductive material underlying them. These photocharge collecting regions would be considered the only photosensing sites of consequence, if the CCD registers and their underlying bulk had radiation shields. The buried implantation under the CCD registers prevents charge carriers generated in the underlying bulk from diffusing directly into the CCD registers. These charge carriers diffuse to the photocharge collecting regions, improving the fill factor.

There is charge photogenerated in the parallelly arrayed CCD registers themselves, responsive to some radiant energy penetrating through the buried implantations under the registers. This charge accumulates in the CCD registers. To the extent this accumulation takes place when the CCD registers are not being forward clocked for charge transfer, and thus is spatially correlated with the accumulation of charge packets sampling image pixel in adjacent charge integrating sites, the accumulation of charge carriers generated in the CCD registers causes no significant problem. So long as blooming does not occur, possibly there may be some slight loss of spatial resolution. The accumulation of charge carriers generated in the CCD registers during forward clocking gives rise to transfer smear, however. The degree of transfer smear increases proportionally with increase in the time over which forward clocking continues. Transfer smear is substantially less of a problem than in the CCD registers of a back-illuminated imager which does not have a deeply buried implantation under them.

Interline transfer imagers embodying the invention in further of its aspects remove from the video signal from the imager the effects of accumulated charge generated by photoconversion in the CCD registers during forward clocking. The CCD registers include additional charge transfer stages, so photocharge collecting regions load alternate ones of the charge transfer stages. The charge packets accumulated in the intervening charge transfer stages owing to photoconversion are used to compensate the imager video signal for the effects of charge photogenerated in the charge transfer stages loaded from the nominal photosensing sites.

DETAILED DESCRIPTION

Figure 1:
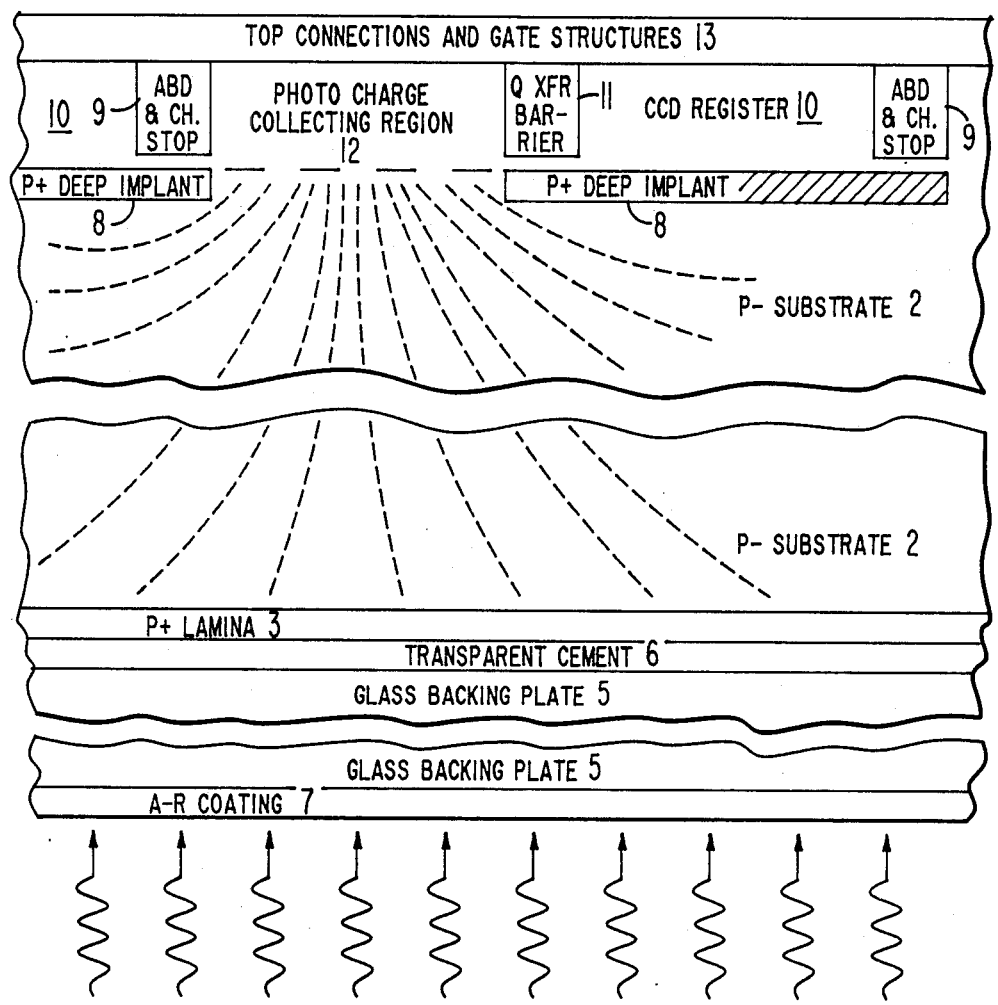
FIG. 1 is a conceptual sketch of a profile portion of a back-illuminated interline-transfer CCD imager constructed in accordance with the invention.

FIG. 1 is a conceptual sketch of the profile or cross-sectional view of a portion of an interline transfer imager embodying the invention. The art of constructing interline transfer imagers is highly developed and quite complex in its range of known variations. Photosensing within the semiconductor substrate may be done using a photodiode structure, or it may be done in a portion of the substrate wherein a potential energy well is electrostatically induced by an overlying gate electrode with suitable voltage applied thereto. The photosensors in successive rows may be arranged in straight-line columns or they may be staggered in spatial phasing. CCD registers for transferring charge packets can be constructed in a variety of ways using multiple-phase clocking, two-phase clocking, or virtual-phase clocking applied by a variety of gate electrode structures. Accordingly, these features are abstracted in FIG. 1 and attention is focused on these features in which the CCD imagers embodying the invention differ from prior art interline transfer CCD imagers.

As in prior art CCD imagers of field transfer type, the imager is constructed on a thinned semiconductive substrate 2, usually p− silicon, about ten microns thick. This construction is carried forward by photolithographic processes on the top surface of substrate 2. These processes take place before the substrate is thinned by a back etching process that leaves the new bottom surface of substrate 2 shown in FIG. 1. This new bottom surface has a lamina 3 of p+ dopant diffused into it, to induce an internal drift field to forestall surface recombination of charge carriers generated by photoconversion in substrate 2 bulk. The bottom surface of substrate 2 is laminated to the top surface of an optically transparent glass backing plate 5 with a layer 6 of optically transparent cement, usually an epoxy. Glass backing plate 5 bottom surface is treated with an anti-reflection (a-r) coating 7. Generally, many imagers are constructed on each semiconductive wafer, thinned except at its rim; and the imagers are separated into individual dies after the laminating of the glass backing plate and the coating of the glass plate with a-r coating 7. The separated dies are then packaged, with provisions being made for electrically contacting portions of the imagers.

During the operation of the interline transfer imager in accordance with the invention, incident radiation from a projected image impinges on the a-r coating 7, travels through glass backing plate 5, and penetrates the semiconductive substrate 2 to generate charge carriers by photoconversion. That is to say, in the parlance of solid-state imager television camera designers, the imager is "back-illuminated".

Consider now the structural features which facilitate back-illumination. The structural features of primary interest are deeply implanted p+ regions 8 underlying the CCD registers 10. One viewing FIG. 1 sights into the charge transfer channel of a representative one of these CCD registers 10. The CCD register charge transfer channels may also be buried with respect to the top surface of substrate 2 by an n diffusion lamina (not shown) at that surface. The deeply implanted p+ regions 8 not only bury the regions 9, in which antiblooming drain and channel stop structures are disposed, with respect to the bottom surface of substrate 2. The deeply implanted p+ regions 8 also bury with respect to the bottom surface of substrate 2 the CCD register 10 charge transfer channels, which structural novelty is critical to the operation of the imager in accordance with the present invention. The widths of charge transfer channels of the CCD registers 10 are defined by channel stops in regions 9 and by charge transfer barriers 11. The charge transfer barriers 11 are selectively erected between CCD registers 10 and photocharge collecting regions 12 as controlled by gate electrodes disposed atop substrate 2 in the top connections and gate structures portion 13 of the CCD imager. A plurality of the photocharge collecting regions 12 are lined up along each of CCD registers 10 and transfer charge packets to respective charge transfer stages of the CCD register when the charge transfer barrier 11 between them is lowered. The photocharge collecting regions may be n+ diffusions forming photodiodes with p− substrate 2, for example, or may be wells induced by gate structures in portion 13 of CCD imager.

Consider now what happens after photoconversion takes place in substrate 2. A substantial portion of the photoconversion occurs in the p− bulk under the photocharge collecting regions 12. The resulting charge carriers thermally diffuse, exhibiting Brownian movement, but also experience drift field diffusion towards photocharge collecting regions 12. The general paths for this drift field diffusion are represented by dashed lines in FIG. 1.

Another substantial portion of the photoconversion occurs in the p− bulk under the CCD register charge transfer channels. The p+ regions 8, which bury the CCD register charge transfer channels, direct the drift field away from themselves. So the charge carriers generated by this portion of photoconversion do not diffuse directly upward, but diffuse sideways and upward, to be collected in one of the photocharge collecting regions 12.

Another portion of the photoconversion occurs in the photocharge collecting regions 12 themselves, responsive to far-penetrating portions, mostly in the red end, of the visible-light spectrum.

Some relatively small portion of the radiant energy will penetrate through p+ regions 8 to the CCD register charge transfer channels and will generate photocharge in those charge transfer channels. How to accommodate the photocharge attributable to this portion of photoconversion is an aspect of the invention and will be dealt with specifically further on in this specification.

Figure 2:
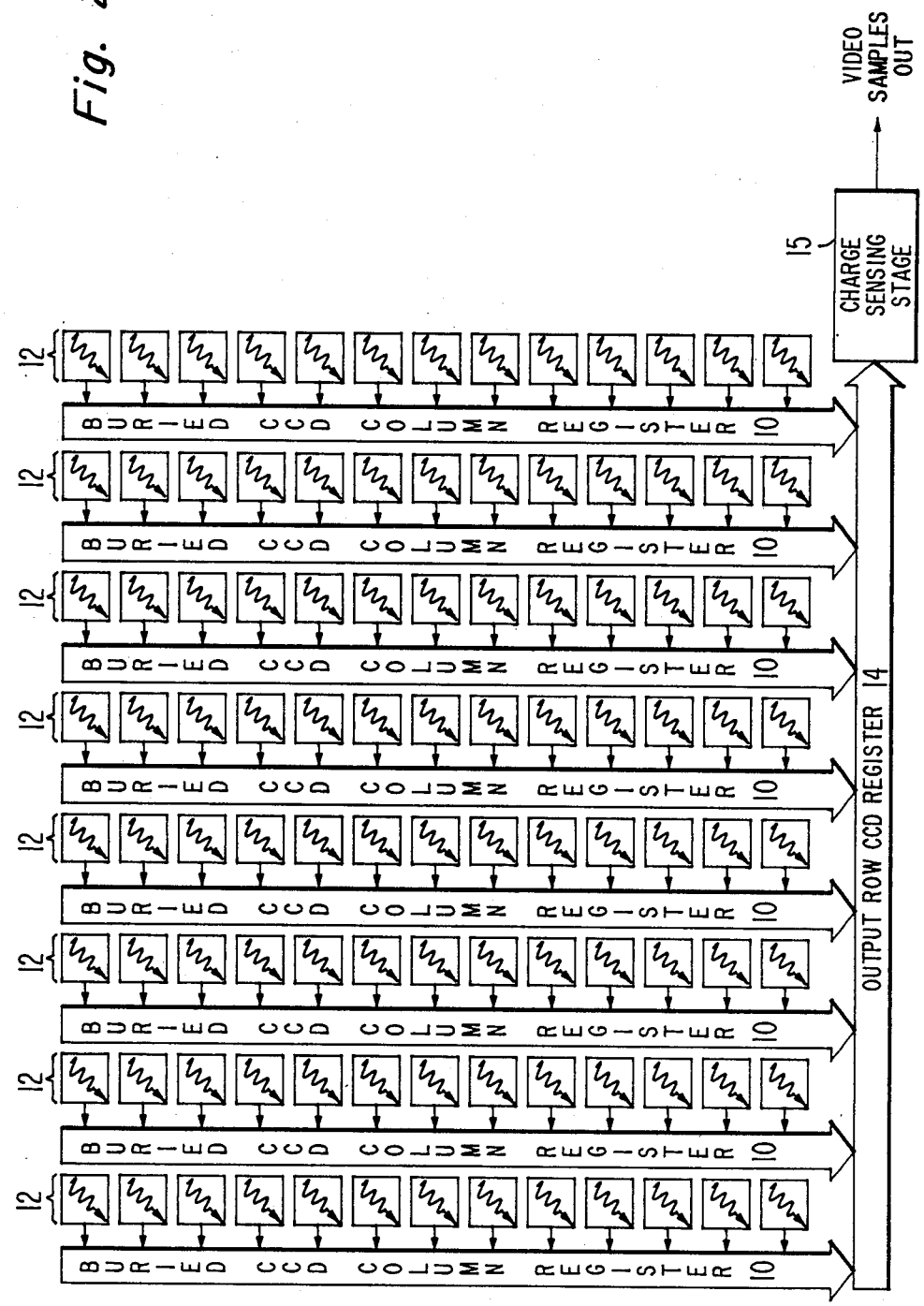
FIG. 2 is a block schematic diagram of the architecture for charge transfer in a back-illuminated vertical-interline-transfer CCD imager in which the invention is embodied.

FIG. 2 shows an interline transfer imager in which rows of photocharge collecting regions 12, represented by squares receiving radiation input (depicted as wavy-shafted arrows), transfer charge packets to columnar buried CCD registers 10. CCD registers 10 are operated as shift registers to load charge packets in parallel into an output row CCD register 14. CCD register 14 is forward clocked during line trace intervals to supply charge packets serially as input signal to a charge sensing stage 15 to be converted into respective samples of a video output signal.

This general type of interline transfer imager may be referred to as a "vertical interline transfer" CCD imager, inasmuch as line scan is conventionally horizontal, row CCD registers extend in direction of line scan, and column CCD registers extend in the direction perpendicular to line scan. The FIG. 2 vertical interline transfer CCD imager is back-illuminated in contrast to prior art CCD imagers of this general type, and it is constructed in accordance with in FIG. 1.

In the FIG. 2 interline-transfer CCD imager, charge packets descriptive of all the lines in the field are simultaneously transferred from photocharge collecting regions 12 into adjacent charge transfer stages of column CCD registers 10. These simultaneous transfers are made during field retrace interval. The lines of charge packets are then advanced a given number of charge transfer stages during each line retrace interval in the succeeding field trace interval, with a line of charge packets transferred out of the first charge transfer stages of column CCD registers 10 loading ones of successive charge transfer stages in row CCD register 14. In essence, the column CCD registers 10 are used as a field store, from which lines of charge packets are read out serially, to provide the charge packets in each line parallelly for loading output row CCD register 14.

The operation of the FIG. 2 imager as thus far described is generally the same as for certain front-illuminated imagers with irradiation shields over the column CCD register. FIG. 2 imager is back-illuminated and the column CCD registers 10 are buried by deep p+ implants 8 under them. The problem with the operation described above (in the specific context of the FIG. 2 imager) is that unwanted charge carriers generated by photoconversion in the column CCD registers 10 have substantial portions of the field trace interval in which to accumulate, insofar as the later lines of charge packets are concerned. Since accumulation time cannot, practically speaking, be substantially shortened in this particular type of imager, the inventor advocates compensation against the accumulated unwanted charge carriers when the FIG. 2 interline transfer imager is operated this way. This compensation can be provided by interleaving the lines of charge packets representative of image element intensity with lines of null charge packets in the successive ranks of column CCD register 10 charge transfer stages. The lines of null charge packets are augmented by the accumulation of charge carriers generated by unwanted photoconversion in the column CCD register 10 in substantially the same amount as adjoining lines of charge packets representative of image element intensity. Differentially combining the electrometer response to those adjoining lines of null charge packets and lines of charge packets representative of image element intensity will generate lines of video signal samples representative of image element intensity, without augmentation by response to the accumulated charge carriers generated by unwanted photoconversion in the column CCD registers 10.

Figure 3:
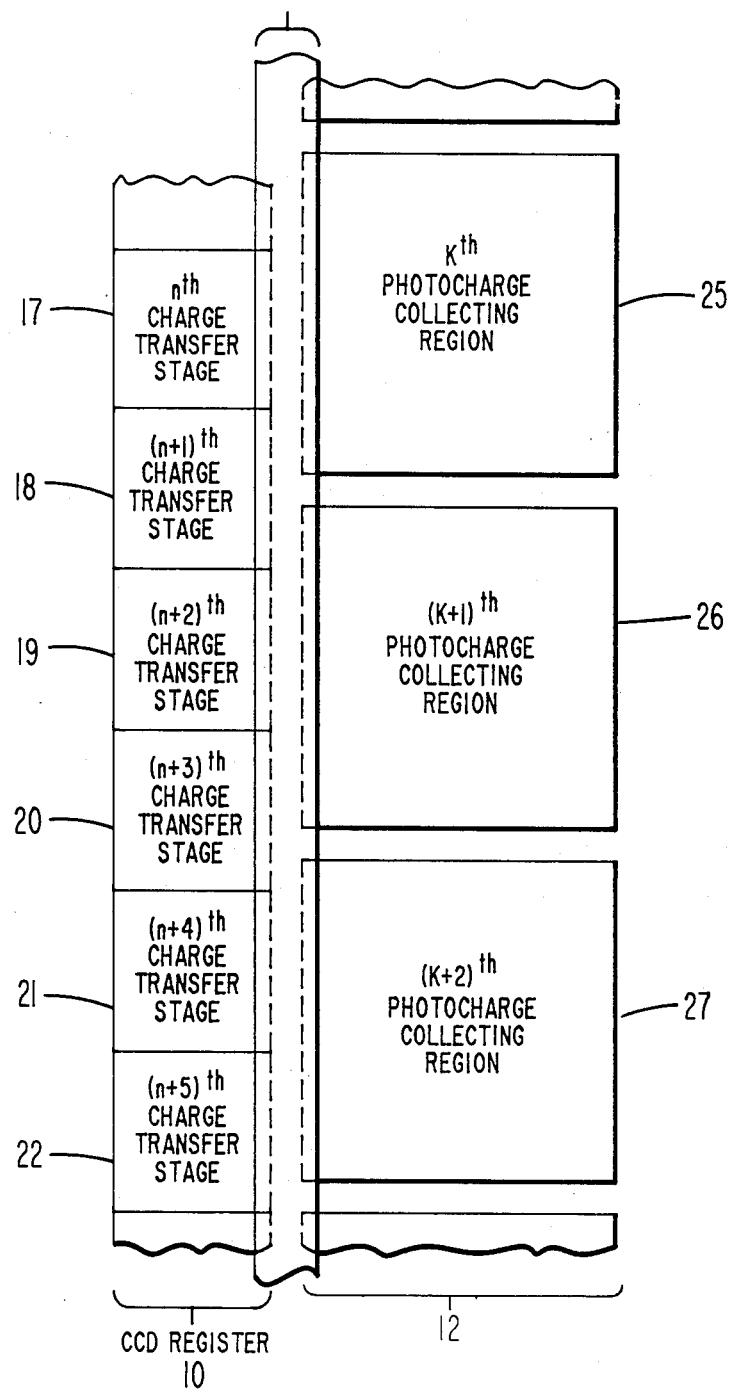
FIGS. 3 and 4 are schematic diagrams of alternate ways of constructing the FIG. 2 CCD imager to implement suppression of unwanted photoresponse.

FIG. 3 is referred to in describing in further detail a way of interleaving lines of null charge packets between lines of charge packets representative of image element intensity in the FIG. 2 imager. This way can be used when line interlace between alternate fields is not used. The number of photocharge collecting regions 12 in each column of them in the FIG. 2 imager is presumed to equal the number of active lines per field, and the number of charge transfer stages in each adjoining column CCD register 10 is twice as large. Charge transfer stages 17–22 are the $n^{th}$ through $(n+5)^{th}$ of these charge transfer stages respectively, n being a positive odd integer.

The odd-numbered charge transfer stages (17, 19, 21, etc.) of column CCD register 10 have charge packets transferred to them from respective ones (25, 26, 27, etc.) of photocharge collecting regions 12 when charge transfer gate 23 receives a transfer pulse during the field retrace interval, which pulse lowers the barrier 11 to charge transfer in the underlying portion of semiconductor substrate 2. The even-numbered charge transfer stages (18, 20, 22, etc.) do not receive charge from the photocharge collecting regions 12. The selective transfer of charge packets only to the odd-numbered charge transfer stages of CCD register 10 is assured by surrounding the regions 12 by channel stops except under portions of charge transfer gates (23, etc.) next to the odd-numbered charge transfer stages of CCD register 10. Forward clocking of CCD register 10 during the previous field scan has swept its charge transfer stages of charge other than the transfer smear and dark current accumulated during and after that field scan. So the even-numbered stages of the column CCD registers 10 of the FIG. 2 imager are filled with lines of null charge packets as desired. During field scan the column CCD registers 10 are forward clocked to advance charge packets by two charge transfer stages during each line retrace interval.

In a variant of the FIG. 3 imager operation just described, one may arrange for erasure of remnant charge in CCD registers 10 prior to charge transfer to them from charge collecting regions 12. If the FIG. 3 imager is modified to include anti-blooming drains located to the left of each column CCD register 10 and to the right of each column of photocharge collecting regions 12, this can be easily done by pulsing the gate electrodes of column CCD registers 10 negative in potential relative to the anti-blooming drains, prior to charge transfer from photocharge collecting regions 12 to column CCD register 10.

Figure 4:
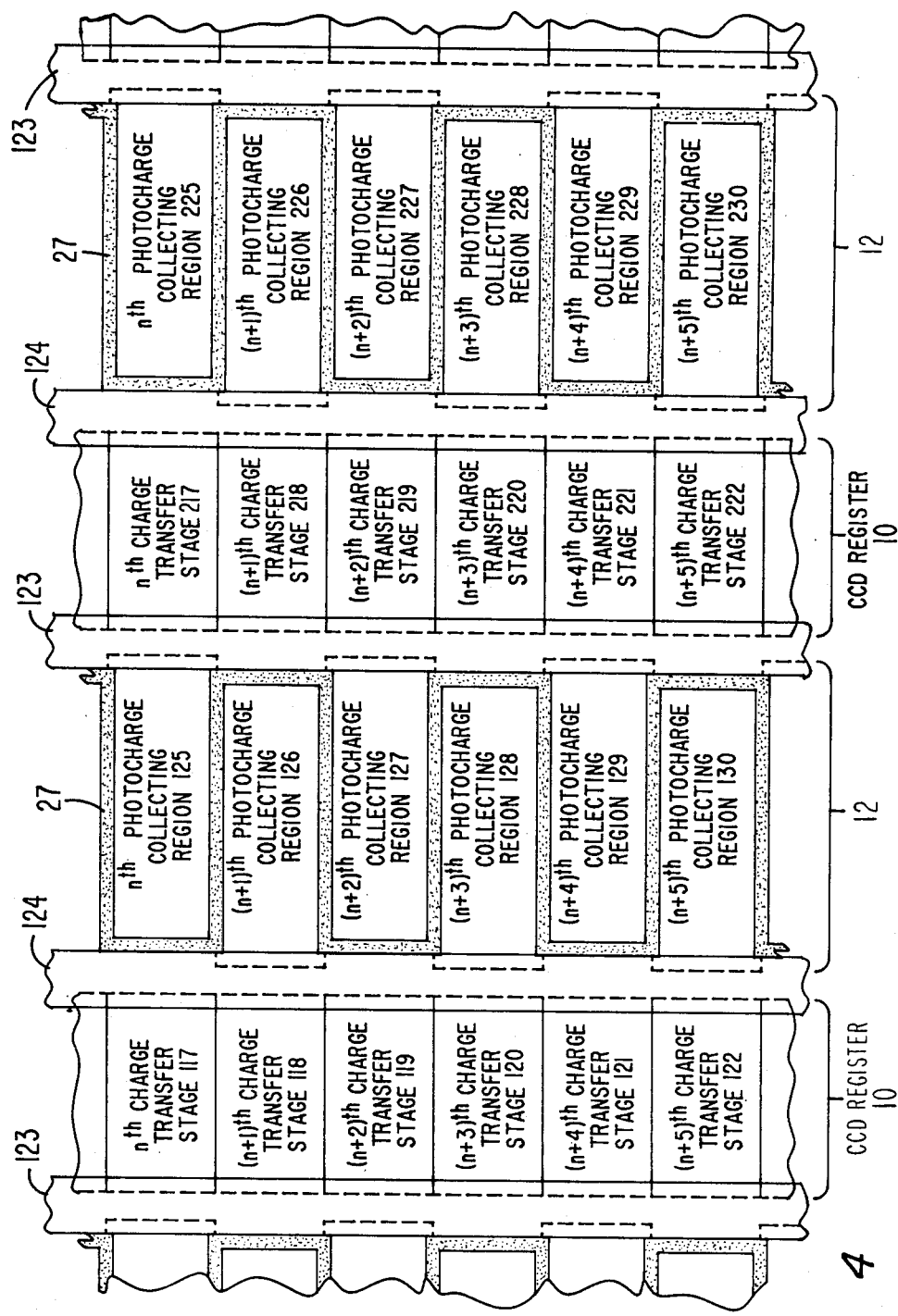

FIG. 4 shows a way of interleaving lines of null charge packet with image-descriptive charge packets when line interlace between alternate fields is used. The photocharge collecting regions 12 are arranged in columns through which wind serpentine channel stops 27 shown in stipple. Relatively negative voltages are customarily applied to transfer gate electrodes 123 and 124 to induce barriers to charge transfer from the ends of the photocharge collecting regions 12 not closed off by the serpentine channel stops 27. Assuming n to be an odd integer, the odd-numbered photocharge regions 125, 127, 129; 225, 227, 229, etc. transfer their accumulated charge packets to the right when the barriers under the transfer gate electrodes 123 are lowered responsive to the gate electrodes 123 being positively pulsed during the field retrace between the even- and odd-numbered field scans. The odd-numbered charge transfer stages 117,119,121; 217,219,221, etc. in each column CCD register 10 are thus loaded with charge packets descriptive of image while the even-numbered charge transfer stages 118,120, 122; 218, 220, 222, etc. are empty except for transfer smear and dark current components remaining from the preceding field scan. Then, during field trace interval in the odd field scan, these charge packets in the column CCD registers 10 are clocked forward two charge transfer stages for each output video signal line, as in the case with the imagers without line interlace.

Then, during the field retrace between the odd- and even-numbered field scans, the even-numbered photocharge collecting regions 126, 128, 130; 226, 228, 230, etc. transfer their accumulated charge packets to the left when the barriers under the transfer gate electrodes 124 are lowered responsive to the gate electrodes 124 being positively pulsed. The even-numbered charge transfer stages 118, 120, 122; 218, 220, 222, etc. in each column CCD register 10 are thus loaded with charge packets descriptive of image while the odd-numbered charge transfer stages 117, 119, 121; 217, 219, 221, etc. are empty except for transfer smear and dark current components remnant from the preceding field scan. Then, during field trace in the even field scan, these charge packets in the column CCD registers 10 are clocked forward two charge transfer stages for each output video signal line, as in the case with the imagers without line interlace.

Figure 5:
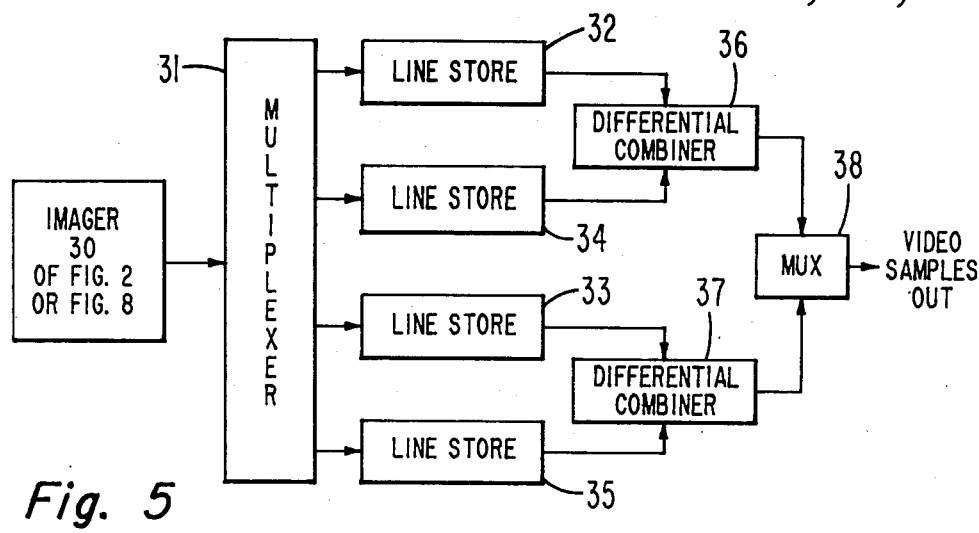
FIG. 5 is a block diagram of apparatus to be used in combination with the FIG. 2 CCD imager to suppress unwanted photoresponse in accordance with an aspect of the invention.
Figure 6:
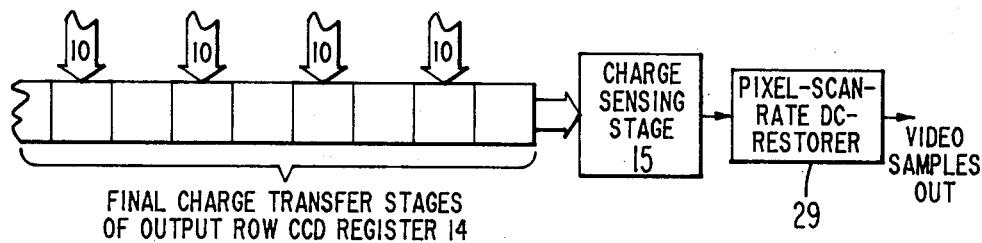
FIGS. 6 and 7 show alternative output register modifications that can be made to the FIG. 2 CCD imager to suppress unwanted photoresponse in accordance with an aspect of the invention.
Figure 7:
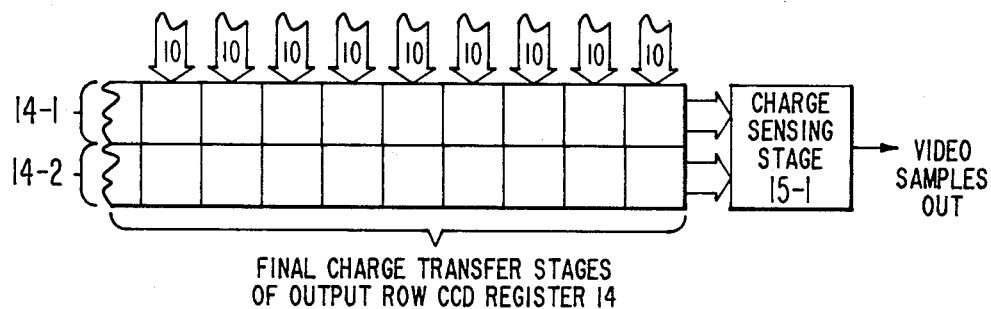

Consider now how the lines of charge packets representative of image element intensity are differentially combined with adjacent lines of null charge packets, following the CCD column registers 10. FIGS. 5, 6 and 7 show alternatives for performing this function.

In FIG. 5 the differential combining is done outside the CCD imager 30, which is a species of the FIG. 2 (or FIG. 8) CCD imager from which two rows of charge packets are read out successively during a single line time interval in the final output video signal. The apparatus may be such as to operate on an analog basis, or the imager 30 output signal samples may be digitized in an analog-to-digital converter, and the procedures to be described can then be carried forward on a digital basis. A multiplexer 31 alternates writing lines of imager 30 output signal samples representative of image element intensities into line stores 32 and 33, and alternates writing lines of imager 30 output signal samples representative of null charge packets into line stores 34 and 35.

After line stores 32 and 34 have both been written, which takes place serially at twice normal pixel scan rate during one line time of video output signal, in the next line time they are read out in parallel at normal pixel scan rate to a differential combiner 36; and differential combiner 36 output signal is selected by a multiplexer 38 to supply video output signal samples during this next line time. During this next line time, multiplexer 31 directs the writing of line stores 33 and 35.

In the succeeding line time, multiplexer 31 again directs the writing of line stores 32 and 34. Line stores 33 and 35 are read out at normal pixel scan rate to a differential combiner 37, and multiplexer 38 selects the output signal of differential combiner 37 to supply output signal samples.

FIG. 6 shows one way of doing the differential combining of successive lines of samples within a modified FIG. 2 imager. CCD row register 14 is made to have such pitch that CCD column registers 10 load every other one of its successive charge transfer stages. After a line of null charge packets is loaded, the CCD row register 14 is forward clocked one cycle. Then a line of per charge packets descriptive of image element intensities is loaded, to interleave with null charge packets in the successive charge transfer stages of row register 14. The whole loading procedure just described takes place during one line retrace interval. Charge sensing stage 15 following CCD row register 14 is followed by a dc-restoration circuit 29. Dc-restorer 29 is operated to clamp the alternate "null" or transfer-smear only responses to reference direct potential, thereby to complement transfer smear accompanying the nulls. This subtracts away the transfer smear component accompanying the pixel samples admitted to the dc-restoration circuit when it is operated out-of-clamp. So the video samples out from the dc-restorer 29 are substantially free of transfer smear. Alternative ways of differentially combining pairs of successive samples from charge sensing stage 15 are known and may be employed instead of dc-restorer 29, of course.

FIG. 7 shows another way of doing the differential combining of successive lines of samples in a modified FIG. 2 imager. CCD row register 14 is replaced by two side-by-side CCD registers 14-1 and 14-2. These registers 14-1 and 14-2 have one or more transfer gates (not explicitly shown) between them which allow the charge transfer stages of register 14-1 to be unloaded in parallel to load the adjoining charge transfer stages of register 14-2. During line retrace intervals a first line of charge packets furnished in parallel from the CCD column registers 10 loads the charge transfer stages of CCD registers 14-1. A second line of charge transfer packets furnished in parallel from the CCD column registers 10 loads CCD register 14-1 as it unloads in parallel to load the charge transfer stages of CCD register 14-2. Both CCD registers 14-1 and 14-2 are then serially unloaded in synchronism to a charge sensing stage 15-1. Charge sensing stage 15-1 is of a type which senses the difference between pairs of charge packets simultaneously supplied to it. Such a charge sensing stage is described, for example by D. G. Meading in U.S. Pat. No. 4,104,543 issued 1 August 1978 and entitled "MULTICHANNEL CCD SIGNAL SUBTRACTION SYSTEM."

Figure 8:
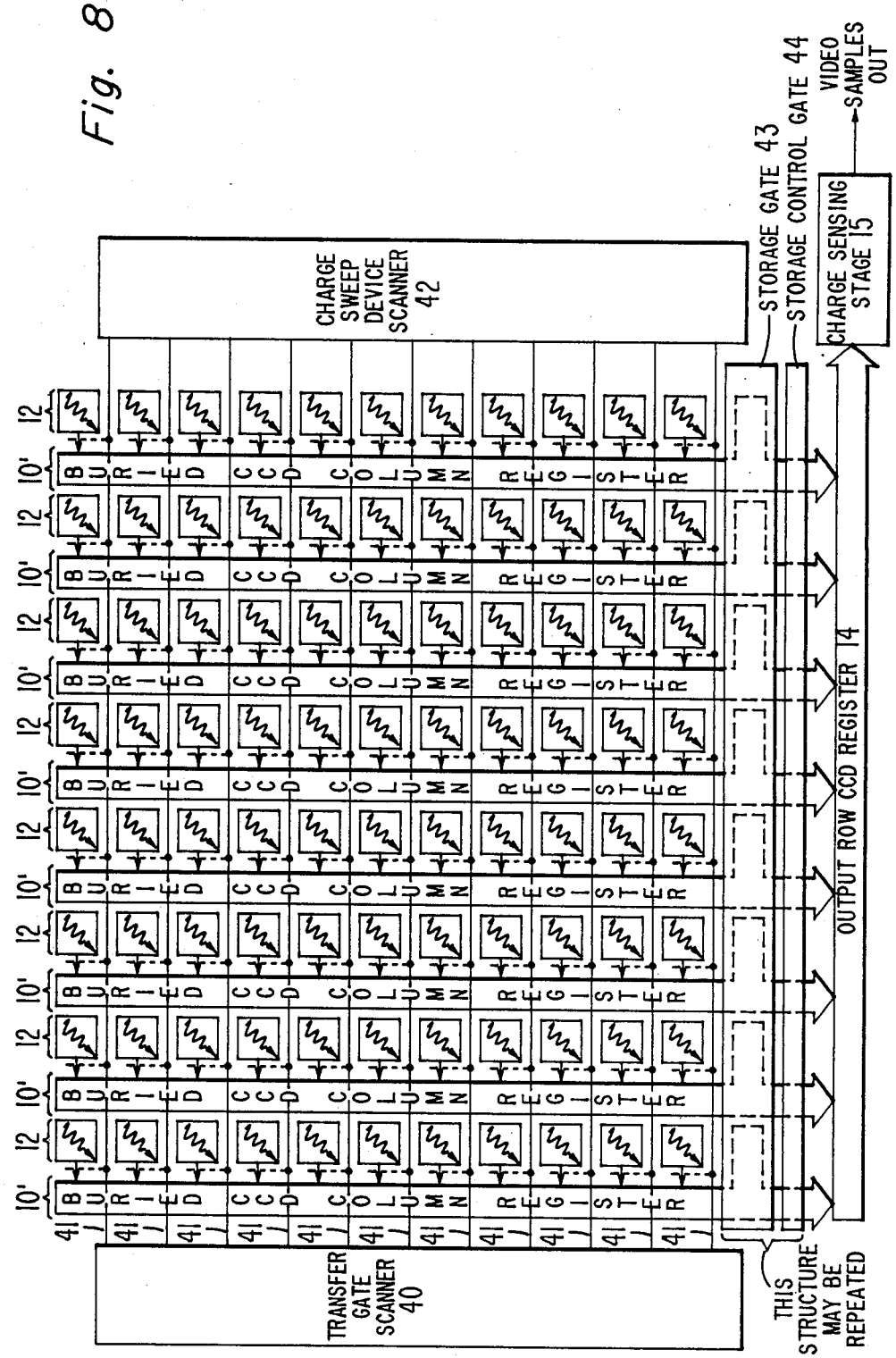
FIG. 8 is a block schematic of the architecture for charge transfer in another back-illuminated vertical-interline-transfer CCD interline-transfer CCD imager in which the invention can be embodied, which imager is of the charge sweep device (CSD) type.

FIG. 8 shows a CCD imager that is of the general type known as a charge sweep device (CSD) type, which has been described by M. Kimata, et alia in the paper "A 480×400 Element Image Sensor with a Charge Sweep Device" appearing on pages 100 & 101 of the 1985 *IEEE INTERNATIONAL SOLID STATE CIRCUITS CONFERENCE DIGEST OF TECHNICAL PAPERS*. The FIG. 8 CSD imager differs from the prior art CSD imagers in that it is constructed as described in connection with FIG. 1 and is back-illuminated. CSD imagers transfer one row of charge packets at a time from charge collecting regions 12 to the column CCD registers 10'. This transfer is done during the line retrace interval in prior art CSD imagers, responsive to line selection pulses from a transfer gate scanner 40. The transfer gate scanner 40 connects to certain ones 41 of the gate electrodes crossing the charge transfer channels of the column CCD registers 10; which gate electrodes also connect to a charge sweep device scanner 42 that controls forward clocking of the column CCD registers 10' during the ensuing line trace interval. Scanner 42 may apply dynamic clocking signals in other phases to other gate electrodes (not shown) interspersed among gate electrodes 41, to implement plural-phase clocking schemes. Scanners 40 and 42 are each operated with tri-state output drive to permit their sharing gate electrodes 41. During the line trace interval, CSD scanner 42 forward clocks the column CCD register 10' in synchronism with the forward clocking of output CCD row register 14, to transfer the charge packets via the column CCD registers 10' to positions under a storage gate electrode 43 crossing the ends of the registers. A storage control gate electrode 44 maintains a barrier potential between the portions of column CCD register 10' charge transfer channels under storage gate electrode 43 and the output row CCD register 14, which is being forward clocked to serially read out a previous row of charge packets to charge sensing stage 15.

Then, during the next line retrace interval, when the succeeding row of charge packets is transferred from charge collecting regions 12 to the column CCD registers 10', storage control gate electrode 44 is pulsed to lower the barrier between the ends of column CCD registers 10' and output row CCD resisters 14 and storage electrode gate 43 is pulsed to transfer its charge packets in parallel into respective charge transfer stages of output row CCD register 14. Output row CCD register 14 forward clocking, halted during this new line retrace interval, then resumes during the next line trace interval to serially transfer the charge packets to charge sensing stage 15. Charge sensing stage 15 responds to the charge packets to generate successive samples of an output video signal.

An advantage of a CSD imager is that since a succession of transferred charge packets is integrated under storage gate electrode 43 as long as storage control electrode gate 44 maintains a barrier to further charge transfer, the individual charge transfers through column C registers 10' need not be complete. That is, considerable inefficiency of charge transfer can be tolerated. This allows one to narrow the column CCD registers 10', so they take up less area on the semiconductive substrate of CCD imager relative to the photocharge collecting regions 12. This improves fill factor in the prior art front-illuminated imager, but is much less significant (if significant to any appreciable degree) in improving the fill factor of the back-illuminated imager of the invention. This also makes it possible in the prior art front-illuminated imager to have the irradiation shields extend further over the column CCD registers 10', to reduce illumination getting under the shields at an angle generating excessive transfer smear. This advantage is irrelevant in back-illuminated CCD imagers embodying the invention, since they have no irradiation shields for the column CCD registers 10'. The narrowed column CCD registers 10' are advantageous in the back-illminated CCD imagers of the present invention, because the unshielded column registers 10' have less area exposed to illumination, so the accumulation of photocharge generated by photoconversion in the registers themselves is reduced, which in turn reduces transfer smear as compared to the FIG. 2 CCD imager embodying the invention.

The CSD completes charge transfer through the column CCD registers 10' in no longer than one line time, rather than over the combined line times of active field scan. This reduces transfer smear about another two-hundred-forty times or so, as compared to the FIG. 2 CCD imager embodying the invention. One may be able to tolerate the transfer smear in a back-illuminated CSD imager employing deep implants under narrow column CCD registers 10' not shielded from illumination. However, consider how transfer smear suppression may be carried out in the FIG. 8 CSD imager.

A first way to provide transfer smear suppression is to sweep the charge packets transferred from the photocharge collecting regions 12 into the column CCD registers 10' through these registers and under storage gate electrode 43 in half a normal line trace interval. At the middle of the normal line trace interval, storage control gate electrode 44 is pulsed relatively positive to lower the barrier to charge transfer as storage gate electrode 43 is made more negative to transfer the charge packets stored thereunder into respective ones of the successive charge transfer stages of output row of CCD register 14. Output row CCD register 14 is then forward clocked at twice normal pixel scan rate to serially read out a line of charge packets descriptive of a line of image samples plus transfer smear during the second half of line trace interval. During the second half of line trace interval, the column CCD registers 10' are forward clocked by CSD scanner 42, although transfer gate scanner 40 provides no selection pulse to transfer image-descriptive charge packets from a line of photocharge collecting regions 12 to the column CCD registers 10'. The transfer smear accumulated by forward clocking CCD registers 10' is collected under storage gate electrode 43 behind a barrier to charge transfer raised by storage control gate electrode 44 again being relatively negative. At the end of line trace interval, storage control gate electrode 44 is pulsed relatively positive, while storage gate electrode 43 is made more negative. This transfers a line of charge packets essentially consisting of transfer smear components into output row CCD register 14. During the first half of the next normal line trace interval, CCD register 14 is forward clocked at twice normal pixel scan rate to serially read out a line of charge packets essentially descriptive just of transfer smear. A differential combining of lines of charge packets descriptive of transfer smear alone with lines of charge packets descriptive of image plus transfer smear is then performed, using the apparatus shown in FIG. 5. Lines of charge packets descriptive of an image, with transfer smear suppressed, are supplied at normal pixel scan rates from the FIG. 5 differential combining apparatus.

Second and third ways to provide transfer smear suppression in a back-illuminated charge sweep device involve modifying the FIG. 8 imager to include two storage gate electrodes at the ends of column CCD registers 10'. In this modification there is one storage gate electrode next to output row CCD register 14 for storing image plus transfer smear samples swept through the preceding portions of column CCD registers 10' in the first half of line trace interval. Before this storage gate electrode, there is another storage gate electrode, for using just transfer smear samples accumulated by continuing sweep through the column CCD registers 10' during the second half of line trace interval. During line retrace interval, the two successive charge packets in the final positions of each of the column CCD registers 10', stored under the two storage gate electrodes, can be clocked into the output row CCD register 14 per FIG. 6 for serial read out to a pixel-scan-rate dc-restorer 29. Or, the pairs of successive charge packets can be transferred into parallelled output row CCD registers 14-1 and 14-2 and then differentially sensed in charge sensing stage 15-1, per FIG. 7.

Figure 9:
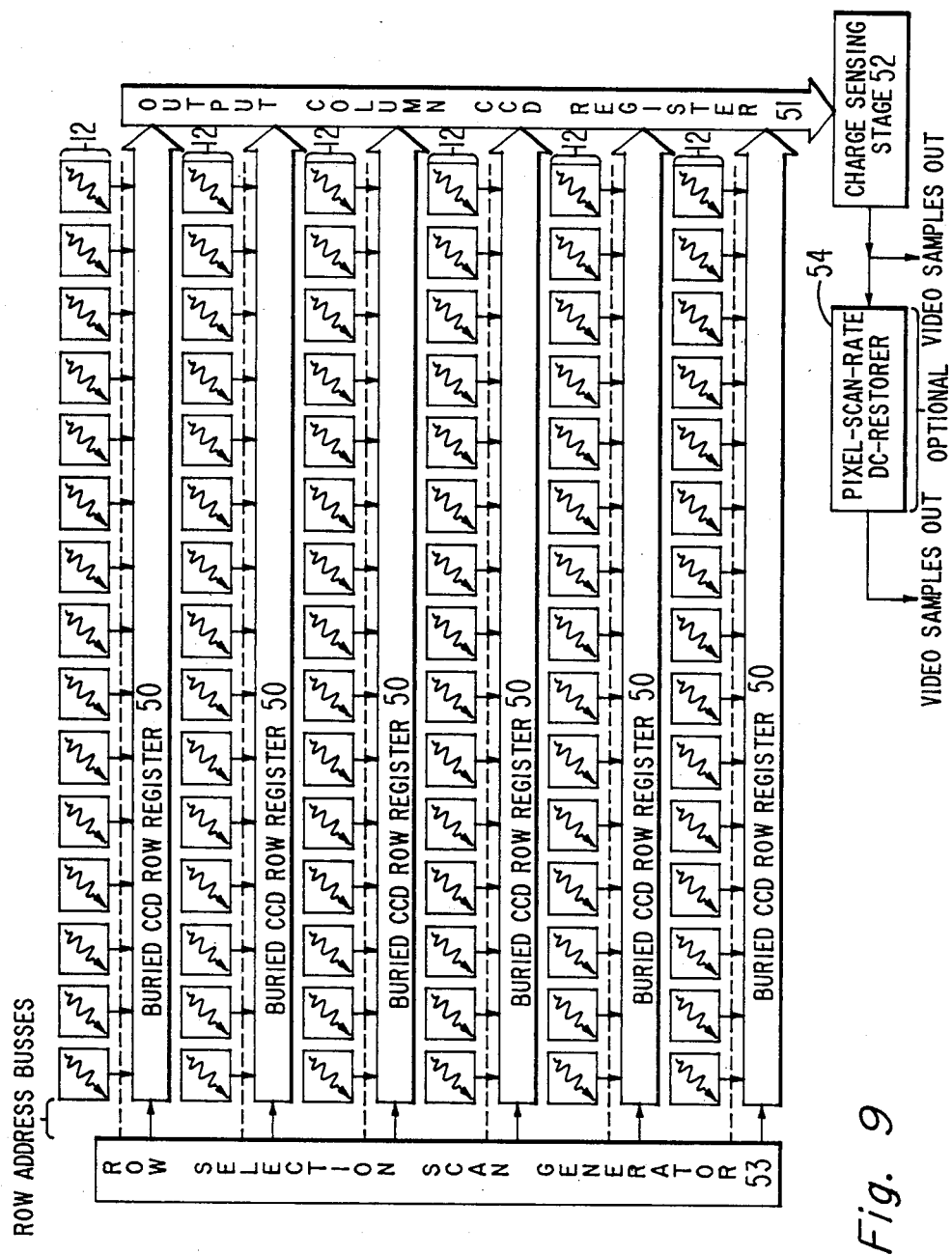
FIG. 9 is a block schematic of the architecture for charge transfer in a back-illuminated horizontal-interline-transfer CCD imager in which the invention is embodied.

FIG. 9 shows an interline transfer imager in which there are rows of photocharge collecting regions 12, represented by squares receiving radiation input, arranged for transferring charge packets accumulated therein to buried row CCD registers 50 parallelling the rows of photocharge collecting regions 12. Transfer is from one row of photocharge collecting regions 12 each line retrace interval into the charge transfer stages of the adjacent one of row CCD registers 50, with the pattern of parallel transfers being cyclic in nature (e.g., such as to effect field-to-field line interlace). The one of row CCD registers 50 into which charge packets have been parallelly transferred during a line retrace interval is forward clocked at pixel scan rate during the following line trace interval to transfer the charge packets from the row CCD register to side-load one of the successive charge transfer stages of output column CCD register 51. CCD register 51 is continuously clocked at pixel scan rate throughout field scan intervals to transfer the charge packets onward from the one of new CCD registers 51 selected for read-out line scan to a charge sensing stage 52, there to be converted into respective successive samples of a video output signal.

This general type of interline transfer imager will be referred to as the "horizontal interline transfer" type in this specification. A row selection scan generator 53 controls the successive parallel transfers of rows of charge packets from rows of photocharge collecting regions 12 to adjacent row CCD registers 50, a row for each line retrace interval, and the successive serial read-out from the row CCD registers 50 in the ensuing line trace intervals.

Row selection scan generator 53 typically includes a CCD shift register, having one transfer stage for each pair of adjacent row CCD registers 50 when field-to-field line interlace is employed, or having one transfer stage for each of row CCD registers 50 when line interlace is not used. A line selection pulse is forward clocked through the CCD shift register in scan generator 53, being advanced one charge transfer stage each line retrace interval. The CCD shift register in the scan generator functions as a multiple-tap delay line for the line selection pulse, each successive tap having an additional delay increment of one line time. The charge levels in the charge transfer stages of the CCD shift register in the scan generator 53 are separately sensed at the respective taps to provide respective control signals.

The control signal from each of these taps is applied to the gate electrode of a respective one of a plurality of field effect transistors, each operative as a transmission gate. The channel of each of the field effect transistors is rendered conductive only when the control signal at its gate electrode is relatively negative, responsive to the charge transfer stage whose charge content is sensed to generate the control signal containing the line selection pulse. One of the plurality of field effect transistors rendered conductive transmits forward clocking signal to the one of row CCD registers 50 selected for serial read out, after others of them have facilitated parallel transfer of charge packets from the selected row of photocharge collection regions 12 to the selected one of row CCD registers 50.

Consider now how the horizontal interline transfer CCD imager of FIG. 9, which is back-illuminated and has a profile cross-section essentially as shown in FIG. 1, differs in its operation from previous front-illuminated horizontal-interline-transfer CCD imagers. There are no irradiation shields formed as fingers in alignment over the row CCD registers 50, in sharp departure from the prior art front-illuminated horizontal interline transfer CCD imagers. Row CCD registers 50 have underlying deeply implanted p+ regions that bury them with respect to the (back-illuminated) bottom surface of the substrate, so charge carriers generated by photoconversion of the back-illumination in the bulk below these deeply implanted p+ regions are collected in the photocharge collecting regions 12 to improve fill factor. One can arrange channel stops so that charge carriers generated in the bulk under one of the row CCD registers 50 are collected in those of photocharge collecting regions 12 from which that row CCD register subsequently conducts charge packets to the output column CCD register 51.

The accumulation of charge carriers generated by photoconversion in the row CCD registers 50 themselves, by back-illumination penetrating through the bulk semiconductor to the row CCD registers 50, has much less adverse effect than in the vertical interline transfer imager. One reason this is so is that the charge accumulated in a charge transfer stage of a row CCD register 50 during the image integration time preceding forward clocking of that row register during its line scan is in spatial resolution with the charge carriers generated in the underlying bulk and collected in the one of photocharge collecting regions 12 associated with that charge transfer stage. When the charge packet accumulated at that photocharge collecting region is transferred into that charge transfer stage, the merged charge in that transfer stage is substantially the totality of the charge carriers generated in the area of the semiconductor substrate underlying that charge transfer stage and its associated photocharge collecting region.

The only components of charge generated by photoconversion in any one of the row CCD registers 50 that are in improper spatial registration are those components of charge generated during the forward clocking of that row register, which components cause a transfer smear. The transfer smear is generated only over a line transfer time, so it is less severe (by a factor equal to the number of active lines per field) than the transfer smear encountered in a vertical-interline-transfer CCD imager in which the column registers are forward clocked over a field scan interval. Except where the image is moving, the transfer smear in a horizontal-interline-transfer CCD imager tends to be constant across the scan line, so it is suppressed by the dc-restoration at line rate that is customarily done in television camera apparatus. Nevertheless, one may wish to suppress transfer smear for moving portions of the image. to suppress transfer smear for moving portions of the image.

In such a case, one may arrange for the row CCD registers 50 to have twice as many charge transfer stages as there are photocharge collection regions 12 to side-load each of them in parallel. Only alternate ones of the charge transfer stages in each of the row CCD registers 50 are side-loaded from respectively adjacent ones of the photocharge collecting regions 12. So the forward clocking of the selected one of the row CCD registers 50 and of the output column CCD register 51 transfers charge packets to charge sensing stage alternate ones of which charge packets sample image pixels plus transfer smear and intervening ones of which charge packets sample transfer smear alone. This optional form of horizontal-interline-transfer CCD imager may then have a pixel-scan-rate dc-restorer 54 in cascade connection thereafter to respond to these CCD imager output samples to supply video samples substantially free of transfer smear.

What is claimed is:

1. A CCD imager of interline transfer type comprising:
   a thinned semiconductive substrate having opposed first and second surfaces separated by a bulk;
   a parallel array of CCD charge transfer channels arranged within said bulk along a portion of said first surface of said semiconductive substrate opposed by a portion of the second surface of said semiconductive substrate that is adapted for illumination by an optical image responsive to which illumination charge carriers are generated within said semiconductive bulk;
   sets of gate electrodes crossing said CCD charge transfer channels for defining successive charge transfer stages in each of said charge transfer channels, said charge transfer stages being separated by electrically insulative layers from each other and the first surface of said substrate, said sets of gate electrodes being receptive of clocking signals selectively supplied to them to transfer charge packets from one charge transfer stage to the next in each of said charge transfer channels;
   photocharge collecting regions in said semiconductive substrate spaced from said second surface by a substantial portion of said bulk and associated with at least selected ones of said charge transfer stages;
   means for selectively transferring at specified times charge packets from each of said photocollecting regions to its associated charge transfer stage;
   means, sensing the amplitudes of charge packets transferred out of the final charge transfer stage of each CCD charge transfer channel in said parallel array, for generating successive samples of a raster scanned video signal, said video signal having field retrace intervals therein, and said video signal having field trace intervals therein comprising interleaved line trace intervals and line retrace intervals; and
   respective implantation regions disposed in said semiconductive substrate between its second surface and each of said CCD charge transfer channels in said parallel array, burying those charge transfer channels respective to the second surface of said semiconductive substrate, for causing charge generated by photoconversion between that second surface and each said charge transfer channel to diffuse towards nearby photocharge collecting regions and thus improve the fill factor of said CCD imager.

2. A CCD imager of interline transfer type as set forth in claim 1 including:
   an output CCD register, having a succession of charge transfer stages therein, each stage arranged for loading from respective ones of said CCD charge transfer channels in said array, and having a following output charge transfer stage; and means for sensing the amplitudes of charge packets transferred through the output charge transfer stage of said output CCD register to generate respective signal samples.

3. A CCD imager of interline transfer type as set forth in claim 2, for generating video signals without line interlace from field to field; wherein said output CCD register is an output row CCD register; wherein said parallelly arrayed CCD charge transfer channels are operable during field trace intervals as column registers with their respective successive charge transfer stages arranged in parallel ranks; wherein said photocharge collecting regions are arranged in rows adjacent to respective alternate ones of these ranks of charge transfer stages; wherein during field retrace intervals said photocharge collecting regions transfer respective charge packets accumulated therein during at least a portion of the preceding field trace interval to respective charge transfer stages in the ranks of charge transfer stages adjacent to them; wherein during line retrace intervals within field trace intervals the charge packets in said column registers are advanced one rank, with the row of charge packets transferred out of said column registers loading the successive charge transfer stages of said output row CCD register; wherein during the first halves of line trace intervals said output row CCD register is forward clocked at twice normal pixel scan rate; wherein, when charge packets transferred into said output row CCD register have been clocked through its output charge transfer stage, the charge packets in said column registers are advanced one rank, with the row of charge packets transferred out of said column registers loading the successive charge transfer stages of said output row register; wherein thereafter, through the remaining portions of line trace intervals, said output row CCD register is forward clocked at twice normal pixel scan rate to clock the charge packets transferred thereto through its output charge transfer stage; and wherein means are provided for differentially combining the samples generated in response to charge packets transferred into said output row CCD register from the same column register during the same line time and re-sampling the resulting difference to normal pixel scan rate to generate a sample of said video signal in which transfer smear is suppressed.

4. A CCD imager of interline transfer type as set forth in claim 2 for generating video signals with line interlace from field to field; wherein said output CCD register is an output row CDD register; wherein said parallelly arrayed CCD charge transfer channels are operable during field trace intervals as column registers with their successive charge transfer stages arranged in parallel ranks; wherein said photocharge regions are arranged in rows adjacent to respective ones of those ranks of charge transfer stages; wherein during field retrace intervals alternate rows of said photocharge collecting regions transfer respective charge packets accumulated therein to respective charge transfer stages in the rank of charge transfer stages adjacent to them, a different one of the two sets of alternate rows of said photocharge collecting regions transferring its charge packets on each successive field; wherein during each of the line retrace intervals within field trace intervals the charge packets in said column registers are advanced one rank, with the row of charge packets transferred out of said column registers loading the successive charge transfer stages of said output row CCD register; wherein during the first halves of line trace intervals said output row CCD register is forward clocked at twice normal pixel scan rate; wherein, when charge packets transferred into said output row CCD register have been clocked through its output charge transfer stage, the charge packets in said column registers are advanced one rank, with the row of charge packets transferred out of said column registers loading the successive charge transfer stages of said output row register; wherein thereafter, through the remaining portions of line trace intervals, said output row CCD register is forward clocked at twice normal pixel scan rate to clock the charge packets transferred thereinto through its output charge transfer stage; and wherein means are provided for differentially combining the samples generated in response to charge packets transferred into said output row CCD register from the same column register during the same line time and re-sampling the resulting difference to normal pixel scan rate to generate a sample of said video signal in which transfer smear is suppressed.

5. A CCD imager of interline transfer type as set forth in claim 2 and of charge sweep device type, for generating video signals without line interlace from field to field; wherein said output CCD register is an output row CCD register having successive charge transfer stages respectively loaded from ends of respective ones of said CCD charge transfer channels; wherein said parallelly arrayed CCD charge transfer channels are operable as column registers with their respective successive charge transfer stages arranged in parallel ranks; wherein said parallelly arrayed CCD charge transfer channels have a storage gate electrode and an ensuing storage control gate electrode disposed over their ends that load said output row CCD register; wherein said photocharge regions are arranged in rows adjacent to respective ones of these ranks of charge transfer stages; wherein during each successive line retrace interval accumulated charge packets are transferred from a successive one of said rows of photocharge collecting regions to the adjacent rank of charge transfer stages; wherein during line retrace intervals said storage gate electrode and said storage control gate electrode receive signals that transfer charge packets from under said storage gate electrode to load respective ones of the charge transfer states of said output row CCD register; and wherein, during line trace intervals, said output CCD register is forward clocked at normal pixel scan rate.

6. A CCD imager of interline transfer type as set forth in claim 2 and of charge sweep device type, for generating video signals with line interlace from field to field; wherein said output CCD register is an output row CCD register having successive charge transfer stages respectively loaded from ends of respective ones of said CCD charge transfer channels; wherein said parallelly arrayed CCD charge transfer channels are operable as column registers with their respective successive charge transfer stages arranged in parallel ranks; wherein said parallelly arrayed CCD charge transfer channels have a storage gate electrode and an ensuing storage control gate electrode disposed over their ends that load said output row CCD register; wherein said photocharge regions are arranged in rows adjacent to respective ones of these ranks of charge transfer stages; wherein during each successive line retrace interval accumulated charge packets are transferred from a successive alternate one of said rows of photocharge collecting regions to the adjacent rank of charge transfer stages; wherein during line retrace intervals said storage gate electrode and said storage control gate electrode receive signals that transfer charge packets from under said storage gate electrode to load respective ones of the charge transfer stages of said output row CCD register; and wherein during line trace intervals said output CCD register is forward clocked at normal pixel scan rate.

7. A CCD imager of interline transfer type as set forth in claim 2 and of charge sweep device type, for generating video signals without line interlace from field to field; wherein said output CCD register is an output row CCD register having successive charge transfer stages respectively loaded from ends of respective ones of said CCD charge transfer channels; wherein said parallelly arrayed CCD charge transfer channels are operable as column registers with their respective successive charge transfer stages arranged in parallel ranks; wherein said parallelly arrayed CCD charge transfer channels have a storage gate electrode and an ensuing storage control gate electrode disposed over their ends that load said output row CCD register; wherein said photocharge regions are arranged in rows adjacent to respective ones of these ranks of charge transfer stages; wherein during each successive line retrace interval accumulated charge packets are transferred from a successive one of said rows of photocharge collecting regions to the adjacent rank of charge transfer stages; wherein during line retrace intervals said storage gate electrode and said storage control gate electrode receive signals that transfer charge packets from under said storage gate electrode to load respective ones of the charge transfer stages of said output row CCD register; wherein, during portions of line trace intervals thereafter, said output CCD register is forward clocked at twice normal pixel scan rate; and said column registers are forward clocked to accumulate transfer smear charge packets under said storage gate electrode; wherein, each time charge packets transferred into said output row CCD register have been clocked through its output charge transfer stage, said storage gate electrode and said storage control gate electrode receive signals that transfer charge packets from under said storage gate electrode to load respective ones of the charge transfer stages of said output row CCD register; wherein thereafter, through the remaining portions of line trace intervals said output CCD register is forward clocked at twice normal pixel scan rate to clock the charge packets transferred thereinto through its output charge transfer stage; and wherein means are provided for differentially combining the samples generated in response to charge packets transferred into said output row CCD register from the same column register during the same line time and re-sampling the resulting difference to normal pixel scan rate to generate a sample of said video signal in which transfer smear is suppressed.

8. A CCD imager of interline transfer type as set forth in claim 2 and of charge sweep device type, for generating video signals without line interlace from field to field; wherein said output CCD register is an output row CCD register having successive charge transfer stages respectively loaded from ends of respective ones of said CCD charge transfer channels; wherein said parallelly arrayed CCD charge transfer channels are operable as column registers with their respective successive charge transfer stages arranged in parallel ranks; wherein said parallelly arrayed CCD charge transfer channels have a storage gate electrode and an ensuing storage control gate electrode disposed over their ends that load said output row CCD register; wherein said photocharge regions are arranged in rows adjacent to respective ones of these ranks of charge transfer stages; wherein during each successive line retrace interval accumulated charge packets are transferred from a successive alternate one of said rows of photocharge collecting regions to the adjacent rank of charge transfer stages; wherein during line retrace intervals said storage gate electrode and said storage control gate electrode receive signals that transfer charge packets from under said storage gate electrode to load respective ones of the charge transfer stages of said output row CCD register; wherein, during portions of line trace intervals thereafter, said output CCD register is forward clocked at twice normal pixel scan rate; and said column registers are forward clocked to accumulate transfer smear charge packets under said storage gate electrode; wherein, each time charge packet transferred into said output row CCD register have been clocked through its output charge transfer stage, said storage gate electrode and said storage control gate electrode receive signals that transfer charge packets from under said storage gate electrode to load respective ones of the charge transfer stages of said output row CCD register; wherein thereafter, through the remaining portions of line trace intervals said output CCD register is forward clocked at twice normal pixel scan rate to clock the charge packets transferred thereinto through its output charge transfer stage; and wherein means are provided for differentially combining the samples generated in response to charge packets transferred into said output row CCD register from the same column register during the same line time and re-sampling the resulting difference to normal pixel scan rate to generate a sample of said video signal in which transfer smear is suppressed.

9. A CCD imager as set forth in claim 2, for generating video signals with line interlace from field to field, wherein said output CCD register is an output column CCD register continuously clocked throughout field trace interval; wherein alternate ones of said parallelly arrayed CCD charge transfer channels are selectively operable as row registers during respective line times in each field trace interval; wherein said photocharge collecting regions are arranged in rows adjacent to respective ones of said CCD change transfer channels; wherein during each line retrace interval charge packets are transferred into the successive charge transfer stages of a CCD charge transfer channel selected for operation as a row register during the next line trace interval, the transfers being from respective ones of the photocharge collecting regions in the row adjacent; and wherein during the remaining portion of each line retrace interval and the ensuing line retrace interval the CCD charge transfer channel selected for operation as a row register is forward clocked at normal pixel scan rate.

10. CCD imager as set forth in claim 2, for generating video signals without line interlace from field to field, wherein said output CCD register is an output column CCD register continuously clocked throughout field trace interval; wherein successive ones of said parallelly arrayed CCD charge transfer channels are selectively operable as row registers during respective line times in each field trace interval; wherein said photocharge collecting regions are arranged in rows adjacent to respective ones of said CCD charge transfer channels; wherein during each line retrace interval charge packets are transferred into the successive charge transfer stages of a CCD charge transfer channel selected for operation as a row register during the next line trace interval the transfer being from respective ones of the photocharge collecting regions in the row adjacent; and wherein during the remaining portion of each line retrace interval and the ensuing line retrace interval the CCD charge transfer channel selected for operation as a row register is forward clocked at normal pixel scan rate.

11. A CCD imager as set forth in claim 2, for generating video signals without line interlace from field to field, wherein said output CCD register is an output column CCD register continuously clocked throughout field trace interval; wherein successive ones of said parallelly arrayed CCD charge transfer channels are selectively operable as row registers during respective line times in each field trace interval; wherein said photocharge collecting regions are arranged in rows adjacent to respective ones of said CCD charge transfer channels; wherein during each line retrace interval charge packets are transferred into alternate ones of the successive charge transfer stages of a CCD charge transfer channel selected for operation as a row register during the next line trace interval from respective ones of the photocharge collecting regions in the row adjacent; and wherein during the remaining portion of each line retrace interval and the ensuing line retrace interval the CCD charge transfer channel selected for operation as a row register is forward clocked at twice normal pixel scan rate; and wherein said signal samples generated by said means for sensing are applied to means for differentially combining each successive pair of those signal samples to provide video signal samples with suppressed transfer smear.

12. A CCD imager as set forth in claim 11 wherein said means for differentially combining consists of a dc-restorer clamping to prescribed direct potential alternate ones of said signal samples generated by said means for sensing.

13. A CCD imager as set forth in claim 2, for generating video signals with line interlace from field to field, wherein said output CCD register is an output column CCD register continuously clocked throughout field trace interval; wherein alternate successive ones of said parallelly arrayed CCD charge transfer channels are selectively operable as row registers during respective line times in each field trace interval; wherein said photocharge collecting regions are arranged in rows adjacent to respective ones of said CCD charge transfer channels; wherein during each line retrace interval charge packets are transferred into the alternate ones of successive charge transfer stages of a CCD charge transfer channel selected for operation as a row register during the next line trace interval from respective ones of the photocharge collecting regions in the row adjacent; wherein during the remaining portion of each line retrace interval and the ensuing line retrace interval the CCD charge transfer channel selected for operation as a row register is forward clocked at twice normal pixel scan rate; and wherein said signal samples generated by said means for sensing are applied to means for differentially combining each successive pair of those signal samples to provide video signal samples with suppressed transfer smear.

14. A CCD imager as set forth in claim 13 wherein said means for differentially combining consists of a dc-restorer clamping to prescribed direct potential alternate ones of said signal samples generated by said means for sensing.

15. A CCD imager of interline transfer type as set forth in claim 1 including:
an output CCD register having a succession of charge transfer stages therein, alternate ones of which are respectively arranged for loading from respective ones of said CCD charge transfer channels in said parallel array of them, and having a following output charge transfer stage;
means for sensing the amplitudes of charge packets transferred through the output charge transfer stage of said output CCD register to generate respective signal samples; and
means for differentially combining each successive pair of these signal samples to provide video signal samples with suppressed transfer smear.

16. A CCD imager as set forth in claim 15 wherein said means for differentially combining consists of a dc-restorer clamping to prescribed direct potential alternate ones of said signal samples generated by said means for sensing.

17. A CCD imager of interline transfer type as set forth in claim 15, for generating video signals without line interlace from field to field; wherein said output CCD register is an output row CCD register; wherein said parallelly arrayed CCD charge transfer channels are operable during field trace intervals as column registers with their respective successive charge transfer stages arranged in parallel ranks; wherein said photocharge collecting regions are arranged in rows adjacent to respective alternate ones of these ranks of charge transfer stages; wherein during field retrace intervals said photocharge collecting regions transfer respective charge packets accumulated therein during at least a portion of the preceding field trace interval to respective charge transfer stages in the ranks of charge transfer stages adjacent to them; wherein during each line retrace interval within field trace interval the charge packets in said column registers are advanced first one rank, with the row of charge packets transferred out of said column registers loading the successive charge alternate CCD register transfer stages of said output row CCD register; wherein thereafter during each line retrace interval within field trace interval said output row CCD register is forward clocked to advance one charge transfer stage each charge packet therein; wherein thereafter during each line retrace interval within field trace interval the charge packets in said column registers are advanced another rank, with the row of charge packets transferred out of said column registers leading the successive alternate charge transfer stages of said output row CCD register; and wherein during line trace intervals said output row CCD register is forward clocked at twice normal pixel scan rate.

18. A CCD imager of interline transfer type as set forth in claim 15, for generating video signals with line interlace from field to field; wherein said output CCD register is an output row CCD register; wherein said parallelly arrayed CCD charge transfer channels are operable during field trace intervals as column registers with their respective successive charge transfer stages arranged in parallel ranks; wherein said photocharge regions are arranged in rows adjacent to respective ones of those ranks of charge transfer stages; wherein during field retrace intervals alternate rows of said photocharge collecting regions transfer respective charge packets accumulated to respective charge transfer stages in the rank of charge transfer stages adjacent to them, a different one of the two sets of alternate rows of said photocharge collecting regions transferring its charge packets on each successive field; wherein during each line retrace interval within field trace interval the charge packets in said column registers are advanced first one rank, with the row of charge packets transferred out of said column registers loading the successive alternate charge transfer stages of said output row CCD register; wherein thereafter during each line retrace interval within field trace interval said output row CCD register is forward clocked to advance one charge transfer stage for each charge packet therein; wherein thereafter during each line retrace interval within field trace interval the charge packets in said column registers are advanced another rank, with the row of charge packets transferred out of said column registers loading the successive alternate charge transfer stages of said output row CCD register; and wherein during line trace intervals said output row CCD register is forward clocked at twice normal pixel scan rate.

19. A CCD imager of interline transfer type as set forth in claim 1 including:
parallelly and adjacently disposed first and second output CCD registers having respective successions of charge transfer stages, the charge transfer stages of said first output CCD register respectively arranged for loading from respective ones of said CCD charge transfer channels in said array of them, the charge transfer stages of said second output CCD register respectively arranged for loading from respective ones of the charge transfer stages of said first output CCD register adjacent thereto, the successions of charge transfer stages in said first and second output CCD registers being followed respectively by respective output charge transfer stages; and means sensing the difference between the amplitudes of charge packets transferred through the output charge transfer stages of said first and second output CCD registers for generating samples of video signal.

20. A CCD imager of interline transfer type as set forth in claim 19, for generating video signals without line interlace from field to field; wherein said first and second output CCD registers are output row CCD registers; wherein said parallelly arrayed CCD charge transfer channels are operable during field trace intervals as column registers with their respective successive charge transfer stages arranged in parallel ranks; wherein said photocharge collecting regions are arranged in rows adjacent to respective alternate ones of these ranks of charge transfer stages; wherein during field retrace intervals said photocharge collecting regions transfer respective charge packets accumulated therein during at least a portion of the preceding field trace interval to respective charge transfer stages in the ranks of charge transfer stages adjacent to them; and wherein during line retrace intervals within field trace intervals the charge packets in said column registers are advanced two ranks, with the rows of charge packets transferred out of said column registers loading the successive charge transfer stages of said first and second output row CCD registers respectively.

21. A CCD imager of interline transfer type as set forth in claim 19 for generating video signals with line interlace from field to field; wherein said first and second output CCD registers are output row CCD registers; wherein said parallelly arrayed CCD charge transfer channels are operable during field trace intervals as column registers with their successive charge transfer stages arranged in parallel ranks; wherein said photocharge regions are arranged in rows adjacent to respective ones of those ranks of charge transfer stages; wherein during field retrace intervals alternate rows of said photocharge collecting regions transfer respective charge packets accumulated therein to respective charge transfer stages in the rank of charge transfer stages adjacent to them, a different one of the two sets of alternate rows of said photocharge collecting regions transferring its charge packets on earth successive field; and wherein during line retrace intervals within field trace intervals the charge packets in said column registers are advanced two ranks, with the rows of charge packets transferred out of said column registers loading the successive charge transfer stages of said first and second output row CCD registers respectively.

22. A visible-light imager system for generating successive samples of raster-scanned video signal with low transfer smear, said imager system comprising:
a substrate of semiconductive material;
a plurality of CCD charge transfer channels in parallel array within said substrate, each having a plurality p in number of charge transfer stages consecutively ordinally numbered first through $p^{th}$, those charge transfer stages with similar ordinal numbering being aligned in rows;
a plurality of photosensing sites arranged in a column and row array on said substrate, the columns of said array of photosensing sites parallelling respective ones of said CCD charge transfer channels, each photosite for collecting photocharge generated by photoconversion of an element of a visible light image impinging thereon;
means operative during each field retrace interval in said raster-scanned video signal for transferring packets of collected charge from rows of said photosensing sites to alternate rows of charge transfer stages in said CCD charge transfer channels;
means operative during each field trace interval for advancing charge packets through the p charge transfer stages in each of said CCD charge transfer channels, during this advance portions of said visible light image causing the augmentation of said charge packets of collected photocharge with addditional unwanted photocharge associated with transfer smear and also causing the accumulation of photocharge associated with transfer smear into intervening charge packets;
a further CCD charge transfer channel shielded from illumination and disposed within said substrate so as to extend across the ends of said plurality of CCD charge transfer channels at which their $p^{th}$ charge transfer stages are located, said further CCD charge transfer channel including a succession of charge transfer stages arranged to be loaded with charge packets transferred from respective ones of the $p^{th}$ charge transfer stages of said plurality of CCD charge transfer channels in parallel array;

charge sensing circuitry for generating samples of said video signal in sequential response to charge packets sequentially supplied thereto;

means for transferring each set of charge packets loaded into the charge transfer stages of said further CCD charge transfer channel, down the length of said further CCD charge transfer channel, thence to supply them sequentially to said charge sensing circuitry and generate a line of sequential response from said charge sensing circuitry;

means for differentially combining each successive pair of lines of sequential responses from said charge sensing circuitry and retiming the result to provide a line trace in said raster-scanned video signal.

23. A visible-light imager system as set forth in claim 22 wherein said plurality of CCD charge transfer channels are not substantially shielded from illumination by visible light.

24. A visible-light imager system for generating successive samples of raster-scanned video signal with low transfer smear, said imager system comprising:

a substrate of semiconductive material;

a plurality of CCD charge transfer channels in parallel array within said substrate, each having a plurality p in number of charge transfer stages consecutively ordinally numbered first through $p^{th}$, those charge transfer stages with similar ordinal numbering being aligned in rows;

a plurality of photosensing sites arranged in a column and row array on said substrate, the columns of said array of photosensing sites parallelling respective ones of said CCD charge transfer channels, each photosite for collecting photocharge generated by photoconversion of and element of a visible light image impinging thereon;

means operative during each field retrace interval in said raster-scanned video signal for transferring packets of collected charge from rows of said photosensing sites to alternate rows of charge transfer stages in said CCD charge transfer channels;

means operative during each field trace interval for advancing charge packets through the p charge transfer stages in each of said CCD charge transfer channels, during this advance portions of said visible light image causing the augmentation of said charge packets of collected photocharge with additional unwanted photocharge associated with transfer smear and also causing the accumulation of photocharge associated with transfer smear into intervening charge packets;

a further CCD charge transfer channel shielded from illumination and disposed within said substrate so as to extend across the ends of said plurality of CCD charge transfer channels at which their $p^{th}$ charge transfer stages are located, said further charge transfer channel including a succession of charge transfer stages alternate ones of which are arranged to be loaded with charge packets transferred from respective ones of the $p^{th}$ charge transfer stages of said plurality of CCD charge transfer channels during first portions of line retrace intervals and during second portions of line trace intervals;

means for transferring charge packets by one charge transfer stage in said further charge transfer stages between the first and second portions of each line retrace interval;

charge sensing circuitry for generating samples of video signal in sequential response to the difference between alternate sets of charge packets sequentially supplied thereto; and means for transferring each set of charge packets loaded into the charge transfer stages of said further CCD charge transfer channel down the length of said further CCD charge transfer channel thence to supply them sequentially to said charge sensing circuitry.

25. A visible-light imager system as set forth in claim 24 wherein said plurality of CCD charge transfer channels are not substantially shielded from illumination by visible light.

26. A visible-light imager system for generating successive samples of raster-scanned video signal with low transfer smear, said imager system comprising:

a substrate of semiconductive material;

a plurality of CCD charge transfer channels in parallel array with said substrate, each having a plurality p in number of charge transfer stages consecutively ordinally numbered first through $p^{th}$, those charge transfer stages with similar ordinal numbering being aligned in rows;

a plurality of photosensing sites arranged in a column and row array on said substrate, the columns of said array of photosensing sites parallelling respective ones of said CCD charge transfer channels, each photosite for collecting photocharge generated by photoconversion of an element of a visible light image impinging thereon;

means operative during each field retrace interval in said raster-scanned video signal for transferring packets of collected charge from rows of said photosensing sites to alternate rows of charge transfer stages in said CCD charge transfer channels;

means operative during each field trace interval for advancing charge packets through the p charge transfer stages in each of said CCD charge transfer channels, during this advance portions of said visible light image causing the augmentation of said charge packets of collected photocharge with additional unwanted photocharge associated with transfer smear and also causing the accumulation of photocharge associated with transfer smear in intervening packets;

first and second, further CCD charge transfer channels shielded from illumination and disposed within said substrate, said first further CCD charge transfer channel extending across the ends of said plurality of CCD charge transfer channel at which their $p^{th}$ charge transfer stages are located for having respective successive ones of its charge transfer stages loaded in parallel with charge packets transferred from respective ones of the $p^{th}$ charge transfer stages of said plurality of charge transfer channels in parallel array, said second further CCD charge transfer stage extending alongside said first further CCD charge transfer channel on the side opposite to the ends of the CCD charge transfer channels in said parallel array, said second further CCD charge transfer channel having respective ones of its successive charge transfer stages adjacent to respective ones of the successive charge transfer stages of said first further CCD charge transfer channel for loading of charge packets in parallel therefrom;

means for transferring, during each line retrace interval in said raster-scanned video signal, two successive parallel sets of charge packets from the $p^{th}$ charge transfer stages of said plurality of CCD charge transfer channels in parallel array, said first set being transferred into and out of respective ones of the successive charge transfer stages of said first further CCD charge transfer channel and then into respective ones of the successive charge transfer stages: of said second further CCD charge transfer channel, and said second set being transferred into respective ones of the successive charge transfer stages of said first further CCD charge transfer channel;

charge sensing circuitry for generating samples of said video signal in sequential response to the differences between paired sets of sequential charge packets supplied thereto substantially parallelly in time; and means for transferring, during line trace intervals of said video signal, the sets of charge packets most recently loaded into the charge transfer stages of said first and second further CCD charge transfer channels down the length of said first and second CCD charge transfer channels thence to supply them to said charge sensing circuitry substantially parallelly in time.

27. A visible-light imager system as set forth in claim 26 wherein said plurality of CCD charge transfer channels are not substantially shielded from illumination by visible light.

28. A visible-light imager system for generating successive samples of video signal with low transfer smear, said imager system comprising:

a substrate of semiconductive material;

a CCD charge transfer channel disposed within said substrate and at least partially exposed to visible-light radiation generating photoresponse charge as may give rise to transfer smear, said CCD charge transfer channel having a plurality of successive charge transfer stages;

a plurality of photosensing sites, each corresponding to a respective one of the alternate ones of the successive charge transfer stages in said CCD charge transfer channel said photosensing sites being exposed to respective elements of a visible-light image and collecting respective charge packets generated by photoconversion of their respective elements of the visible-light image;

means operative during recurrent retrace intervals in said video signal for transferring packets of charge from said photosensing sites to the corresponding alternate ones of the successive charge transfer stages of CCD charge transfer channel;

charge sensing circuitry for generating samples of said video signal in response to the difference between each pair of charge packets successively supplied thereto; and means operative during trace intervals between successive ones of said recurrent retrace intervals for transferring charge packets through said CCD charge transfer channel and supplying them successively to said charge sensing circuitry.

* * * * *